United States Patent
Wang et al.

(10) Patent No.: US 9,870,975 B1
(45) Date of Patent: Jan. 16, 2018

(54) CHIP PACKAGE WITH THERMAL DISSIPATION STRUCTURE AND METHOD FOR FORMING THE SAME

(71) Applicant: Taiwan Semiconductor Manufacturing Co., Ltd., Hsinchu (TW)

(72) Inventors: Chin-Hua Wang, New Taipei (TW); Po-Yao Lin, Zhudong Township, Hsinchu County (TW); Shu-Shen Yeh, Taoyuan (TW); Kuang-Chun Lee, New Taipei (TW); Shin-Puu Jeng, Hsinchu County (TW); Shyue-Ter Leu, Hsinchu (TW); Cheng-Lin Huang, Hsinchu (TW); Hsiu-Mei Yu, Zhudong Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/210,343

(22) Filed: Jul. 14, 2016

(51) Int. Cl.
| | |
|---|---|
| *H01L 23/34* | (2006.01) |
| *H01L 23/373* | (2006.01) |
| *H01L 25/065* | (2006.01) |
| *H01L 23/31* | (2006.01) |
| *H01L 23/00* | (2006.01) |

(52) U.S. Cl.
CPC ...... *H01L 23/3736* (2013.01); *H01L 23/3107* (2013.01); *H01L 23/3157* (2013.01); *H01L 25/0657* (2013.01); *H01L 24/17* (2013.01); *H01L 24/49* (2013.01); *H01L 2224/48221* (2013.01); *H01L 2224/4909* (2013.01); *H01L 2225/06541* (2013.01)

(58) Field of Classification Search
CPC ............ H01L 23/3736; H01L 23/3114; H01L 23/3107; H01L 25/0652; H01L 25/115; H01L 25/117
USPC ........................................................ 257/720
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |

(Continued)

*Primary Examiner* — Theresa T Doan
(74) *Attorney, Agent, or Firm* — Birch, Stewart, Kolasch & Birch, LLP

(57) ABSTRACT

Structures and formation methods of a chip package are provided. The chip package includes a first package structure including a first semiconductor die that has a first side and a second side opposite thereto. The chip package also includes a package layer partially or completely encapsulating the first semiconductor die, and a conductive feature in the package layer. The chip package further includes a first heat-spreading layer over the first side of the first semiconductor die and a first cap layer on the first heat-spreading layer.

20 Claims, 17 Drawing Sheets

(56) References Cited

U.S. PATENT DOCUMENTS

| | | |
|---|---|---|
| 8,803,292 B2 | 8/2014 | Chen et al. |
| 8,803,316 B2 | 8/2014 | Lin et al. |
| 2001/0019181 A1* | 9/2001 | Lee .................... H01L 23/4334 257/796 |
| 2006/0170098 A1* | 8/2006 | Hsu .................... H01L 23/5389 257/723 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |

* cited by examiner

CHIP PACKAGE WITH THERMAL DISSIPATION STRUCTURE AND METHOD FOR FORMING THE SAME

BACKGROUND

In the packaging of integrated circuits, semiconductor dies may be stacked and bonded to other package components (e.g., interposers and package substrates). The resulting packages are known as three-dimensional integrated circuits (3DICs). The package-on-package (PoP) structure is one type of 3DIC package, and PoP technology has begun to be developed. In such a PoP structure, a top package with a semiconductor die is bonded to a bottom package with another semiconductor die.

By adopting PoP technology, various packages with different or similar functions are integrated together. However, this packaging technology for semiconductor devices faces manufacturing challenges. For example, the heat dissipation is a challenge in the PoP structure. The heat generated from the semiconductor die may negatively affect the electrical performance of the devices in the semiconductor dies as well as the reliability.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
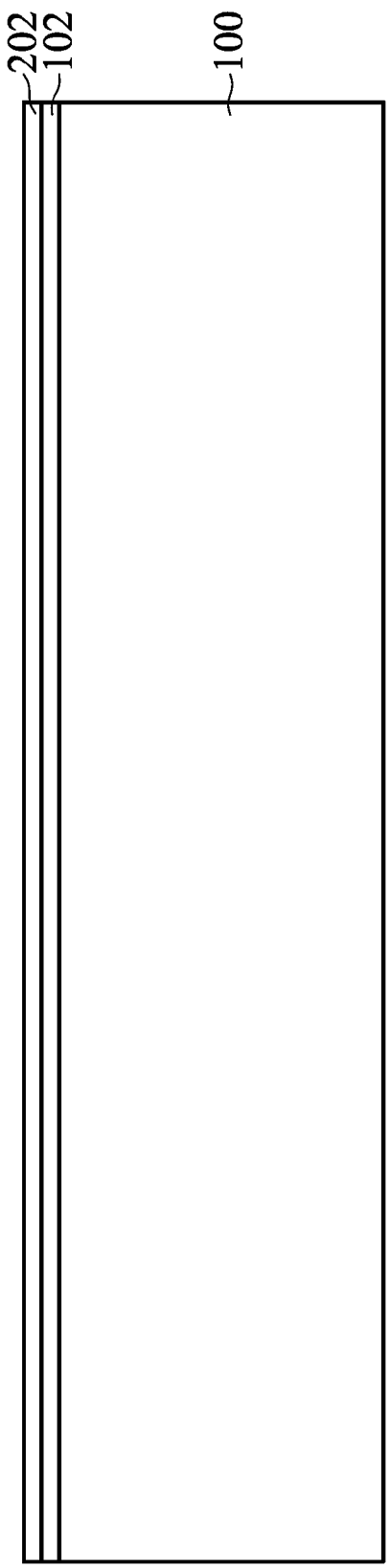
FIGS. 1A-1N are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1N are cross-sectional views of various stages of a process for forming a chip package, in accordance with some embodiments. Additional operations can be provided before, during, and/or after the stages described in FIGS. 1A-1N. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, an adhesive layer 102 and an overlying base layer 202 are deposited or laminated over a carrier substrate 100, in accordance with some embodiments. In some embodiments, the carrier substrate 100 acts as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive.

In some embodiments, the base layer 202 has a material that is different from a thermal interface material (TIM) and is formed on the adhesive layer 102 by a deposition method. Moreover, the base layer 202 has a thickness that is less than that of a thermal interface material. In some embodiments, the base layer 202 is a polymer layer or a polymer-containing layer. For example, the base layer 202 may be a poly-p-phenylenebenzobisthiazole (PBO) layer, a polyimide (PI) layer, another suitable layer, or a combination thereof.

Figure 1B:
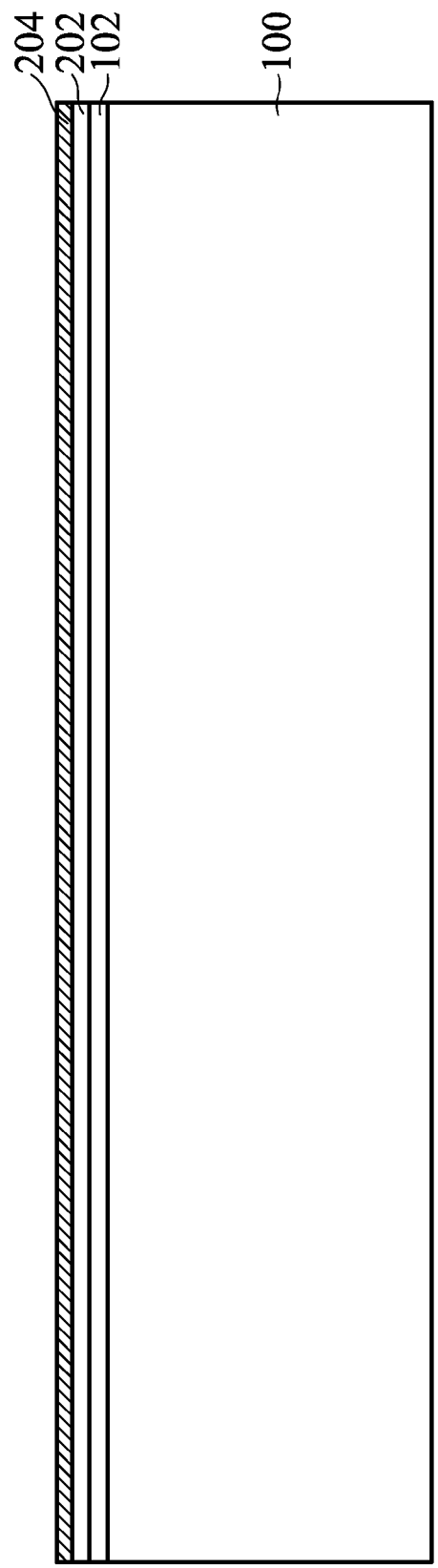

Afterwards, a seed layer 204 is deposited over the base layer 202, as shown in FIG. 1B in accordance with some embodiments. In some embodiments, the seed layer 204 is made of copper. In some embodiments, the seed layer 204 is formed by a physical vapor deposition (PVD) process, a chemical vapor deposition (CVD) process, another applicable process, or a combination thereof. However, embodiments of the disclosure are not limited thereto. Other conductive films may also be used as the seed layer 204. For example, the seed layer 204 may be made of Ti, Ti alloy, Cu, Cu alloy, or a combination thereof. The Ti alloy or the Cu alloy may include silver, chromium, nickel, tin, gold, tungsten, another suitable element, or a combination thereof.

Figure 1C:
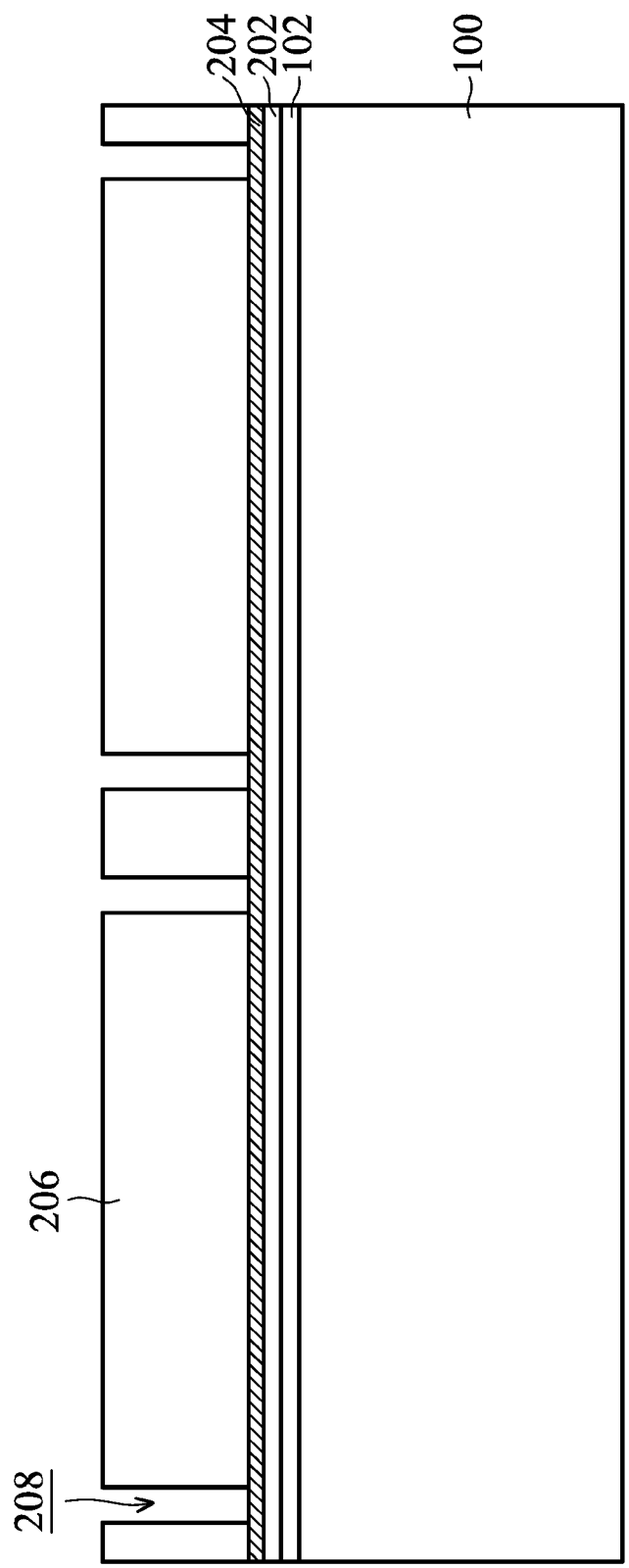

As shown in FIG. 1C, a mask layer 206 is formed over the seed layer 204, in accordance with some embodiments. In the embodiment, the mask layer 206 has one or more openings 208 that expose a portion of the seed layer 204. The openings 208 of the mask layer 206 define the positions where conductive features, such as through package vias (TPVs), are designed to be formed. In some embodiments, the mask layer 206 is made of a photoresist material. In these cases, the openings 208 may be formed by a photolithography process that may include exposure and development processes.

Figure 1D:
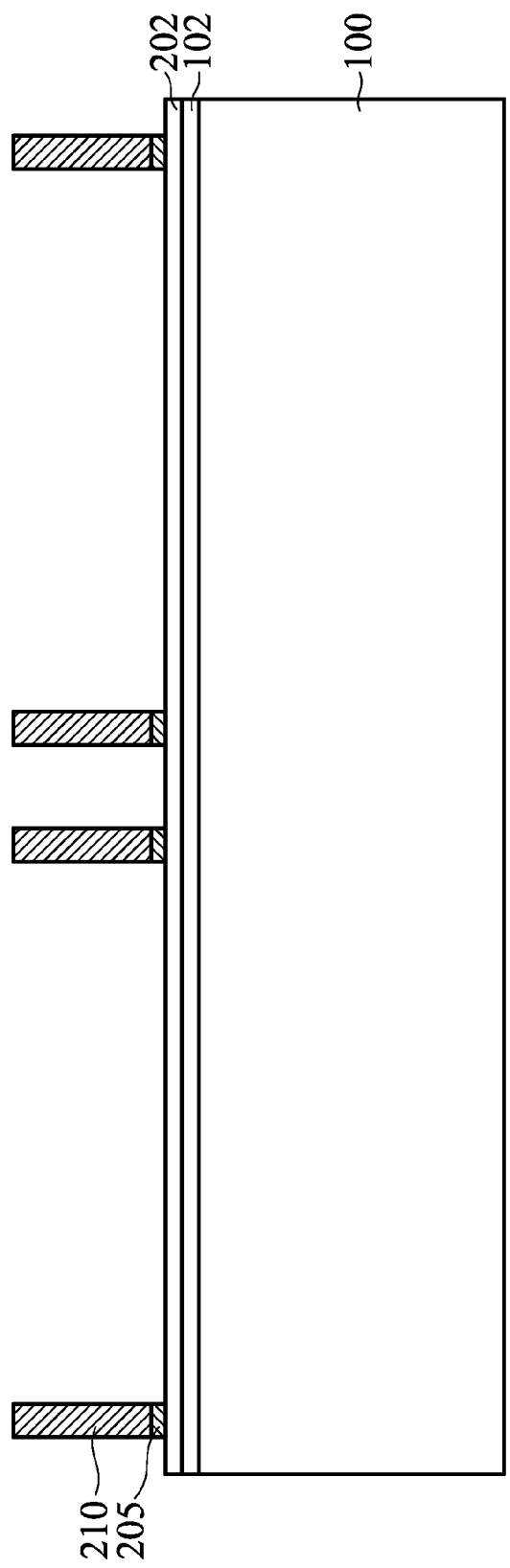

As shown in FIG. 1D, conductive features 210 are correspondingly fill the openings 208 and the seed layer 204 is patterned to form seed elements 205 after removal of the mask layer 206, in accordance with some embodiments. In some embodiments, a conductive material is deposited over the exposed portions of the seed layer 204 to completely or partially fill the openings 208. The conductive material may include copper. Afterwards, the mask layer 206 is removed, and the deposited conductive material forms multiple conductive features 210 (or conductive pillars), as shown in FIG. 1D. The conductive features 210 may be used as etch masks during a subsequent etching in the seed layer 204, so as to form the seed elements 205.

Figure 1E:
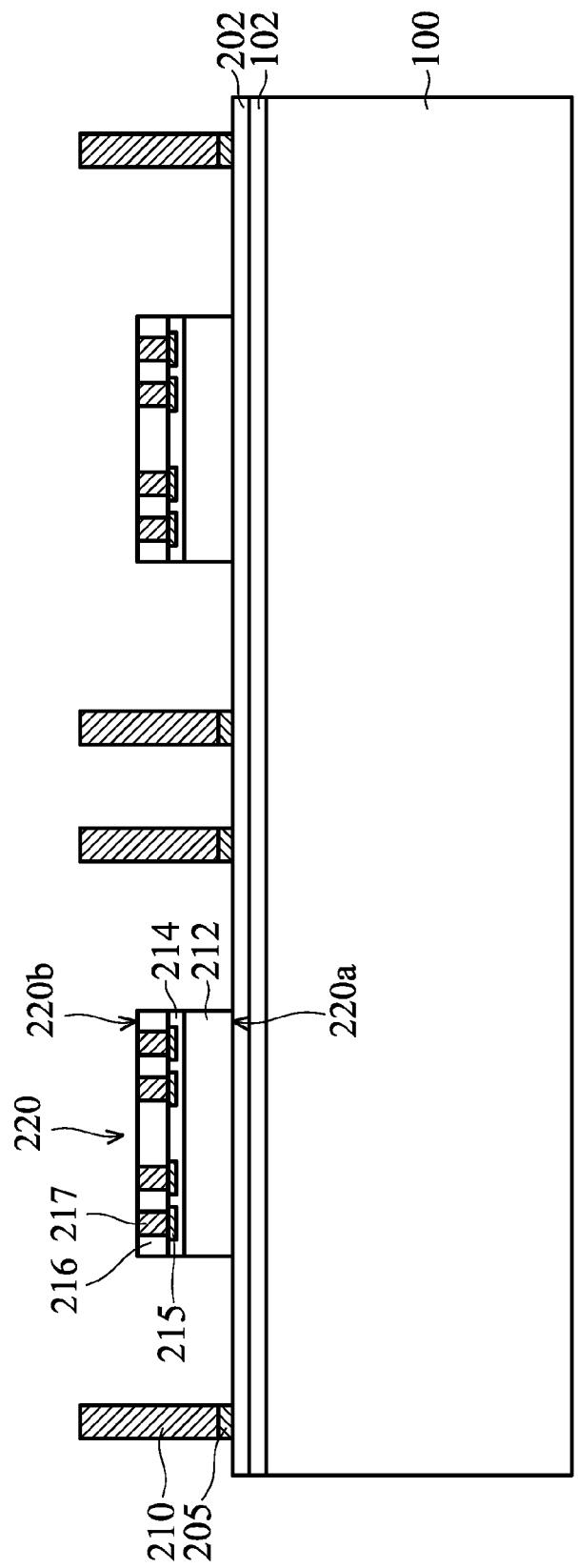

As shown in FIG. 1E, semiconductor dies 220 are attached on the base layer 202, in accordance with some embodiments. In some embodiments, the first sides 220a (e.g., back sides) of the semiconductor dies 220 face the base layer 202 with the second sides 220b (e.g., front sides) of the semiconductor dies 220 facing upwards. Each of the semiconductor dies 220 may include a semiconductor substrate 212 at the first side 220a of the semiconductor die 220 and an interconnect structure over the semiconductor substrate 212. The interconnect structure may include a passivation layer 214 and conductive pads 215 in the passivation layer 214. Each of the semiconductor dies 220 also includes a protection layer 216 at the second side 220b of the semiconductor die 220 and connectors 217 in the protection layer 216.

A variety of device elements (not shown) may be formed in or over the semiconductor substrate 212. Such device elements may include active devices and/or passive devices. An adhesive film (not shown), such as a die attach film (DAF), may be employed to attach the semiconductor dies 220 onto the base layer 202.

Figure 1F:
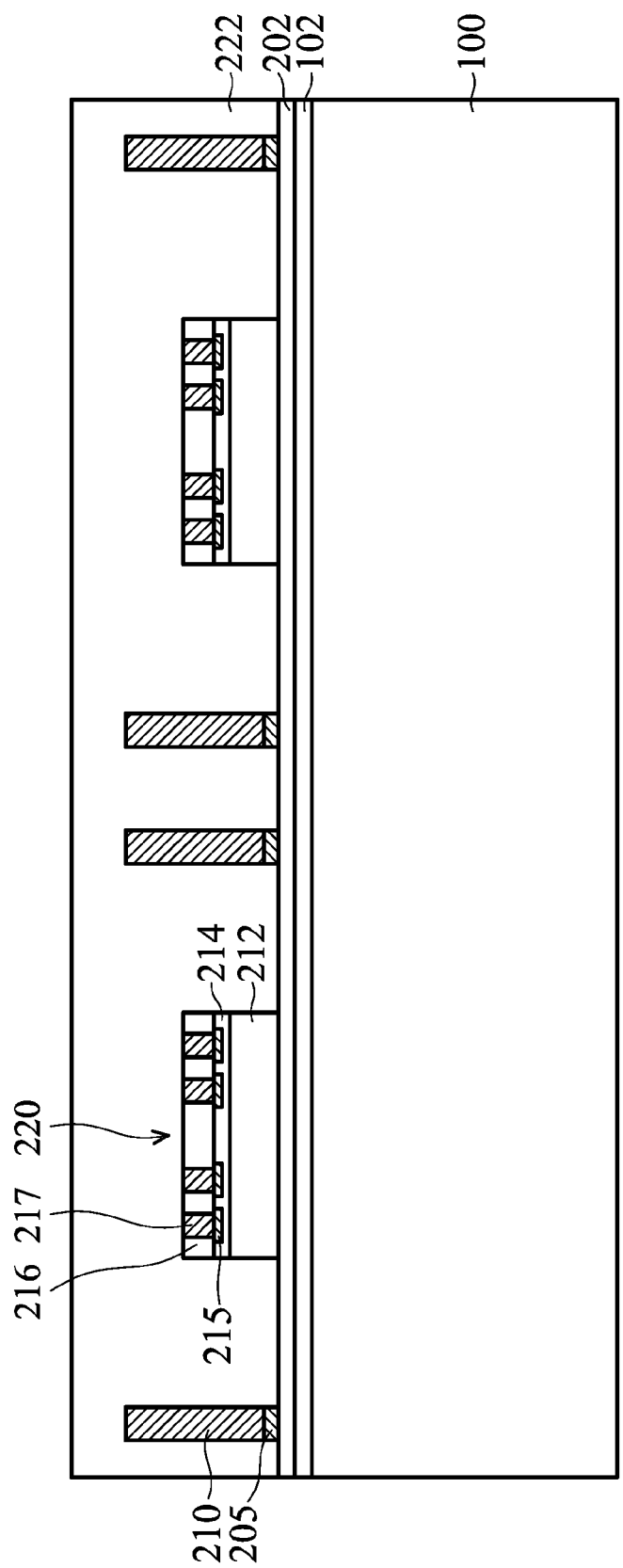

As shown in FIG. 1F, a package layer 222 is formed over the base layer 202, the conductive features 210, and the semiconductor dies 220, in accordance with some embodiments. In some embodiments, the package layer 222 completely encapsulates the semiconductor dies 220, so that the top surfaces and sidewalls of the semiconductor dies 220 are covered by the package layer 222. In some other embodiments, the package layer 222 partially encapsulates the semiconductor dies 220. For example, upper portions of the semiconductor dies 220 are exposed from the top surface of the package layer 222.

In some embodiments, the package layer 222 includes a polymer material. In some embodiments, the package layer 222 includes a molding compound. For example, a liquid molding compound material is applied over the base layer 202, the conductive features 210, and the semiconductor dies 220 to encapsulate the conductive features 210 and the semiconductor dies 220. Afterwards, a thermal process is then applied to harden the liquid molding compound material, thereby transforming it into the package layer 222. In some embodiments, the thermal process is performed at a temperature in a range from about 200 degrees C. to about 230 degrees C. The operation time of the thermal process may be in a range from about 1 hour to about 3 hours.

Figure 1G:
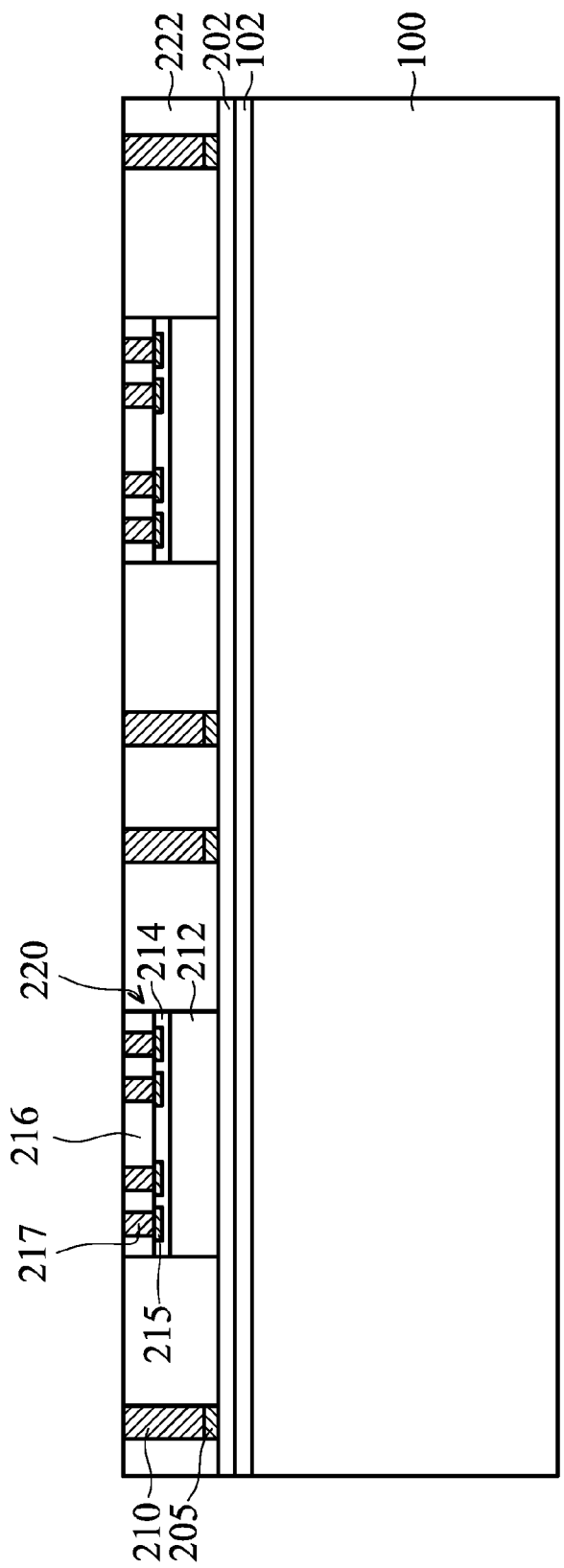

As shown in FIG. 1G, the package layer 222 is thinned to expose the conductive features 210 and the connectors 217 of the semiconductor dies 220, in accordance with some embodiments. For example, a planarization process may be used to thin the package layer 222. The planarization process may include a grinding process, a chemical mechanical polishing (CMP) process, an etching process, another applicable process, or a combination thereof. In some embodiments, upper portions of the conductive features 210 are removed during the planarization process. In some embodiments, the tops of the conductive features 210, the protection layer 216, the connectors 217, and the thinned package layer 222 are substantially coplanar.

Figure 1H:
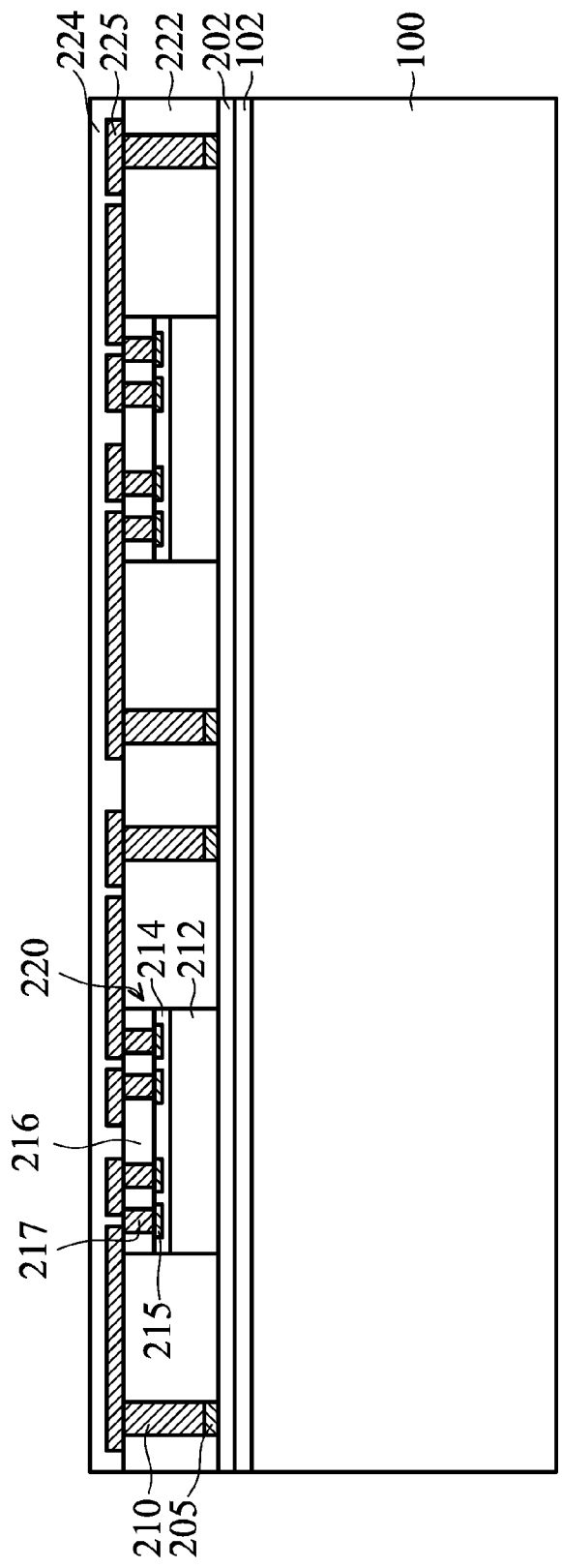

As shown in FIG. 1H, a redistribution structure is formed over the structure shown in FIG. 1G, in accordance with some embodiments. In some embodiments, the redistribution structure includes a redistribution layer 225 that is over the package layer 222 and the second side 220b (indicated in FIG. 1E) of the semiconductor dies 220 and covered by a passivation layer 224. The redistribution layer 225 may be a single layer or a multi-layer structure. In some embodiments, the redistribution layer 225 is a single layer and includes multiple conductive portions. These conductive portions form multiple electrical connections to electrically connect the conductive features 210 and to the connectors 217. For example, a first conductive portion of the redistribution layer 225 may be electrically connected to one of conductive pads 215 through one of the connectors 217. A second conductive portion of the redistribution layer 225 may be electrically connected to one of the connectors 217 to one of the conductive features 210. A third conductive portion of the redistribution layer 225 may be electrically connected to one of the conductive features 210.

The pattern of the redistribution layer 225 can be varied according to design requirements. For example, if a different circuit layout is used to establish the connections between the conductive features 210 and the conductive pads 215, the pattern of the redistribution layer 225 may be varied accordingly. The conductive features 210 may be used as TPVs. In some embodiments, the TPVs surround the semiconductor dies 220. In some embodiments, the redistribution layer 225 is made of a metal material. The metal material may include copper, aluminum, tungsten, nickel, titanium, gold, platinum, silver, another suitable material, or a combination thereof.

The passivation layer 224 may be a single layer or a multi-layer structure. In some embodiments, the passivation layer 224 is a single layer and has openings (not shown) exposing conductive portions of the redistribution layer 225. Bond pads (not shown) may be formed over the exposed redistribution layer 225. The passivation layer 224 is made of dielectric material(s) and provides stress relief for bonding stress incurred during subsequent bonding processes. In some embodiments, the passivation layer 224 is made of a polymer material, such as polyimide, PBO, the like, or a combination thereof. Alternatively or additionally, the passivation layer 224 may include benzocyclobutene (BCB). In some embodiments, the passivation layer 224 includes silicon oxide, silicon oxynitride, silicon nitride, silicon carbide, another suitable material, or a combination thereof.

Multiple deposition, coating, and/or etching processes may be used to form the redistribution structure including the redistribution layer 225 and the passivation layer 224. In some embodiments, one or more thermal processes are performed during the formation the redistribution structure. For example, portions of the passivation layer 224 may be made of a polymer material that is formed using a process involving a thermal operation.

Figure 1I:
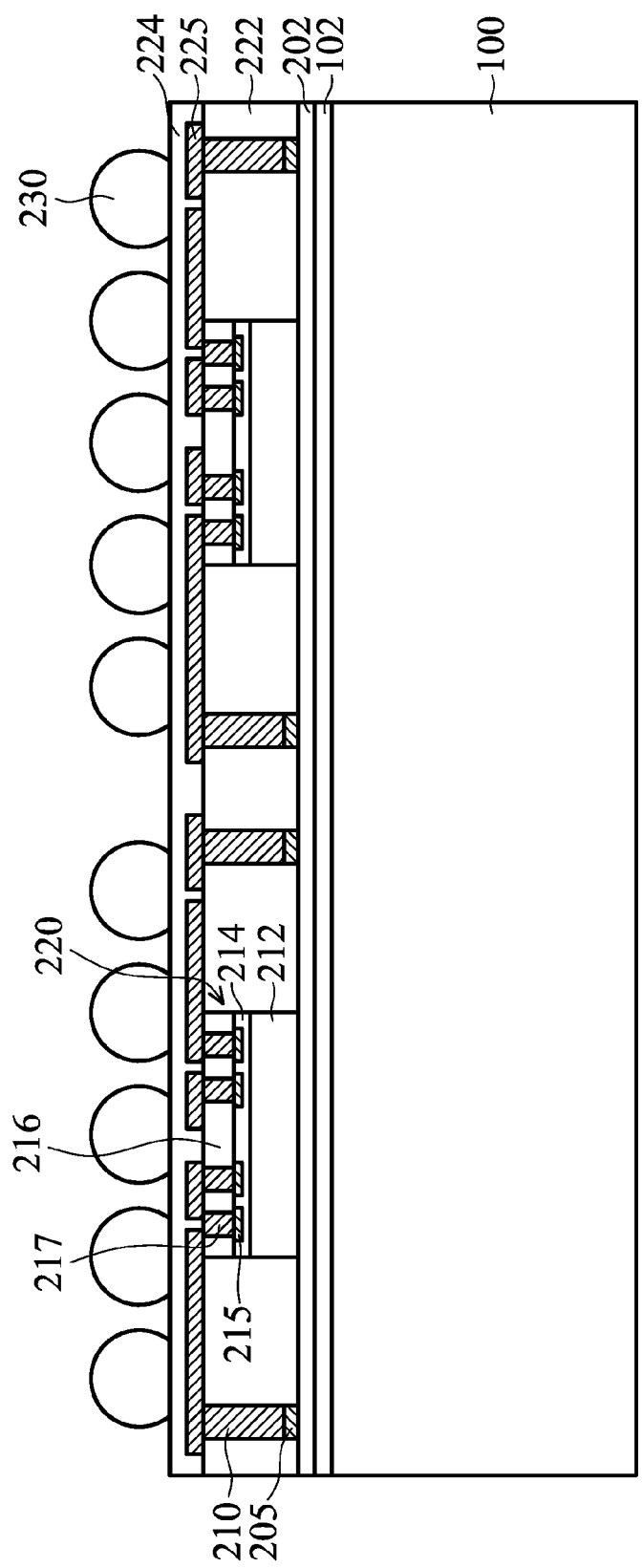

As shown in FIG. 1I, connectors 230 are formed over the passivation layer 224, in accordance with some embodiments. The connectors 230 may be bonded to the bond pads (not shown) of the redistribution structure through the openings (not shown) of the passivation layer 224. Some of the connectors 230 are electrically connected to one of the semiconductor dies 220 through the redistribution layer 225. Some of the connectors 230 are electrically connected to other elements through the redistribution layer 225 and one of the conductive features 210. The connectors 230 may include solder bumps or metal pillars. An under bump metallurgy (UBM) layer (not shown) may be optionally formed below the solder bumps (i.e., the connectors 230).

Figure 1J:
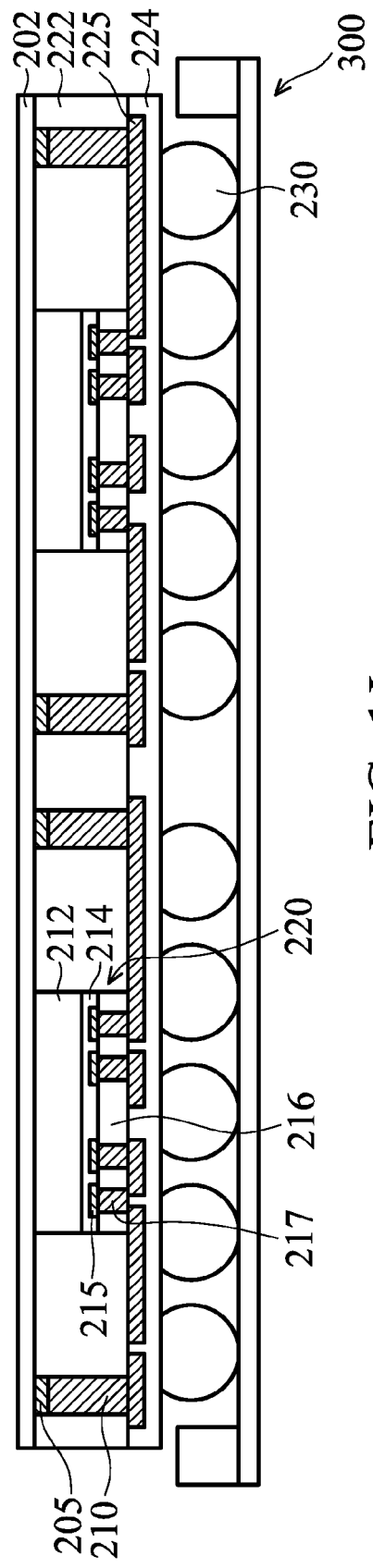

As shown in FIG. 1J, after the connectors 230 are formed, the structure shown in FIG. 1I is flipped and attached to a carrier 300, in accordance with some embodiments. Afterwards, the carrier substrate 100 is removed. In some embodiments, the carrier 300 includes a tape which is photosensitive or heat-sensitive and is easily detached from the connectors 230. In some embodiments, both the carrier substrate 100 and the adhesive layer 102 are removed from the base layer 202. For example, suitable light may be provided to remove the adhesive layer 102, so that the carrier substrate 100 is removed as well.

Figure 1K:
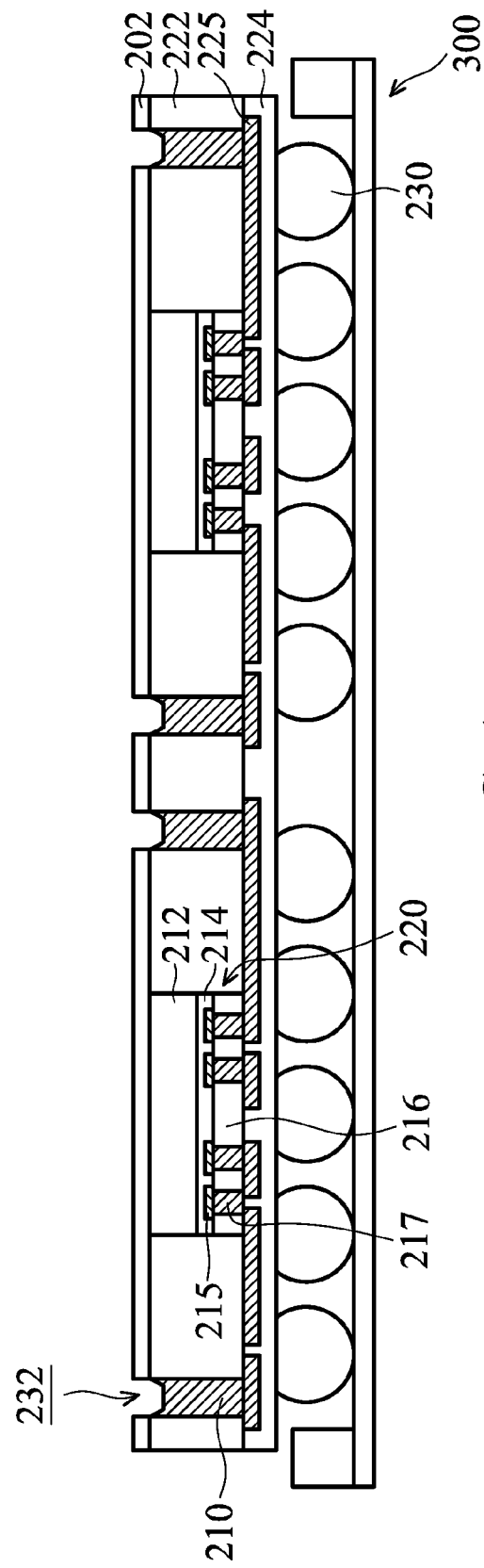

As shown in FIG. 1K, the base layer 202 is patterned to form openings 232 that expose the conductive features 210, in accordance with some embodiments. In these cases, the seed elements 205 are also removed, so that the conductive features 210 pass through the package layer 222. In some other embodiments, the seed elements 205 are not removed or not completely removed, so that the openings 232 expose the seed elements 205. In some embodiments, an etching process is applied to form the openings 232.

Figure 1L:
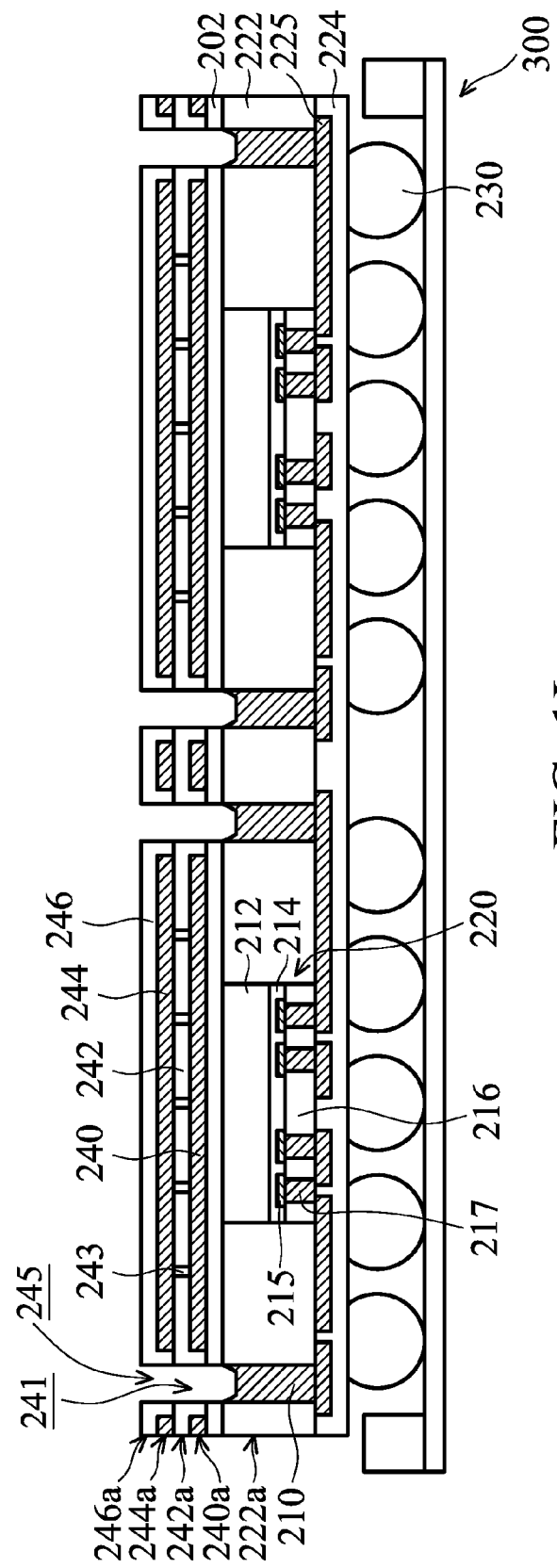

As shown in FIG. 1L, a thermal dissipation structure is formed over the base layer 202 and the conductive features 210, in accordance with some embodiments. In some embodiments, the thermal dissipation structure includes one or more heat-spreading layers and one or more cap layers that are in an alternate arrangement. For example, the thermal dissipation structure includes a first heat-spreading layer 240 over the first side 220a (indicated in FIG. 1E) of the semiconductor dies 220 and a first cap layer 242 on the heat-spreading layer 240. The first heat-spreading layer 240 may be in direct contact with the base layer 202 and the first cap layer 242 may be in direct contact with the first heat-spreading layer 240. In some embodiments, the first heat-spreading layer 240 and the first cap layer 242 extend over the package layer 222, such that the first heat-spreading layer 240 and the first cap layer 242 have sidewalls 240a and 242a, respectively, which are substantially aligned with a sidewall 222a of the package layer 222. In these cases, the first heat-spreading layer 240 has openings 241 to correspondingly expose the conductive features 210. A portion of the first cap layer 242 passes through the first heat-spreading layer 240 via the openings 241, such that top surfaces of the conductive features 210 are surrounded by the first cap layer 242. For example, the first cap layer 242 conformally lines the sidewalls of the openings 241 to expose the conductive features 210. The first cap layer 242 in the opening 241 may have a sidewall that is substantially aligned with a sidewall of the corresponding opening 232 (indicated in FIG. 1K). In some embodiments, the first heat-spreading layer 240 is made of copper, aluminum, gold, silver, tungsten or other suitable metal material with a high heat transfer coefficient. In some embodiments, the first heat-spreading layer 240 is formed by a PVD process, a CVD process, another applicable process, or a combination thereof. In some embodiments, the first cap layer 242 is made of a material that is the same as or similar to that of the base layer 202. For example, the first cap layer 242 is a polymer layer or a polymer-containing layer, such as a PBO layer or a PI layer. However, embodiments of the disclosure are not limited thereto. Other dielectric films may also be used as the first cap layer 242.

In some embodiments, as shown in FIG. 1L, the thermal dissipation structure further includes a second heat-spreading layer 244 and an overlying second cap layer 246 stacked on the first cap layer 242. The second heat-spreading layer 244 may be in direct contact with the first cap layer 242 and the second cap layer 246 may be in direct contact with the second heat-spreading layer 244. Similarly, the second heat-spreading layer 244 and the second cap layer 246 extend over the package layer 222 and have sidewalls 244a and 246a, respectively, that are substantially aligned with the sidewall 222a of the package layer 222. Moreover, the second heat-spreading layer 244 has openings 245 to correspondingly expose the conductive features 210. A portion of the second cap layer 246 passes through the second heat-spreading layer 244 via the openings 245, such that top surfaces of the conductive features 210 are also surrounded by the second cap layer 246. For example, the second cap layer 242 conformally lines the sidewalls of the openings 245 to expose the conductive features 210. The second cap layer 246 in the opening 245 may have a sidewall that is substantially aligned with a sidewall of the corresponding opening 232 (indicated in FIG. 1K). The materials and formation of the second heat-spreading layer 244 and the second cap layer 246 may be the same as or similar to these of the first heat-spreading layer 240 and the first cap layer 242.

In some embodiments, thermal conductive plugs 243 are formed to pass through the first cap layer 242, thereby connecting the first heat-spreading layers 240 and second heat-spreading layers 244. The thermal conductive plugs 243 may be made of metal, such as copper, and formed by a PVD process, a CVD process, another applicable process, or a combination thereof.

Note that embodiments of the disclosure are not limited to FIG. 1L. Based on the requirements of thermal dissipation, one or more alternate arrangement including the heat-spreading layer and the cap layer may be stacked on the second cap layer 246. For example, one or more stacks of a third heat-spreading layer (not shown) and a third cap layer (not shown) may be disposed on the second cap layer 246. Moreover, thermal conductive plugs may be formed between the adjacent third heat-spreading layers.

In some embodiments, a dicing process is performed to separate the structure shown in FIG. 1L into multiple chip packages. In some other embodiments, more elements may be stacked on or bonded onto the structure as shown in FIG. 1L before the dicing process.

According to some embodiments of the disclosure, since the heat-spreading layer, such as copper, has better thermal conductivity and larger heat capacity, the thermal transfer rate can be effectively improved. Moreover, the heat-spreading layer can be formed on the underlying base layer without using an additional TIM layer. As a result, the thermal transfer rate can be improved further. Additionally, since the thermal dissipation structure including one or more heat-spreading layers and one or more cap layers can improve the thermal transfer rate, there is no need to increase the thickness of the semiconductor dies for heat dissipation. As a result, compared to the case of increasing the thickness of the semiconductor dies for heat dissipation, the increase of the dimensions (e.g., the height) of the package can be minimized.

Figure 1M:
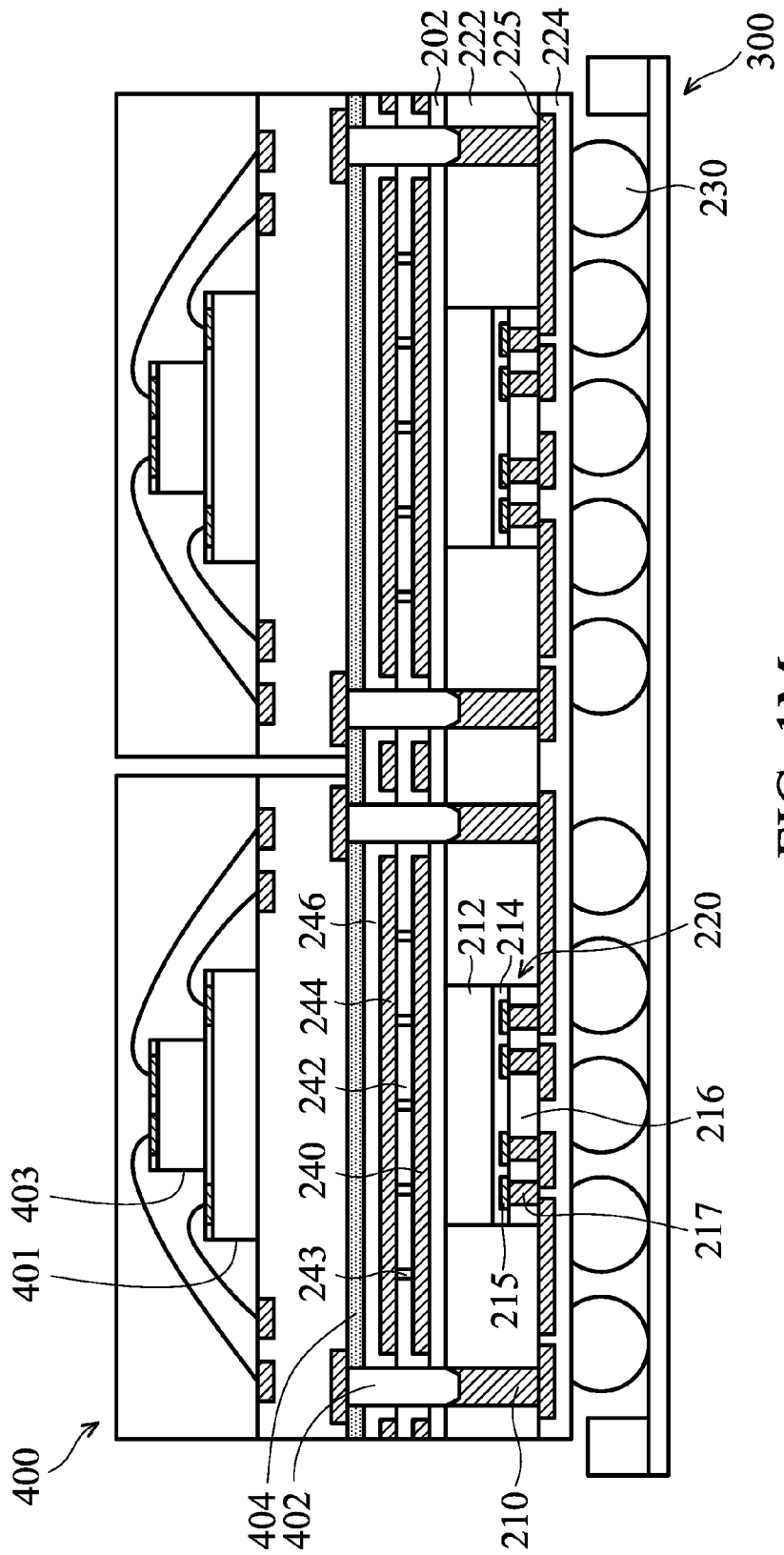
Figure 1N:
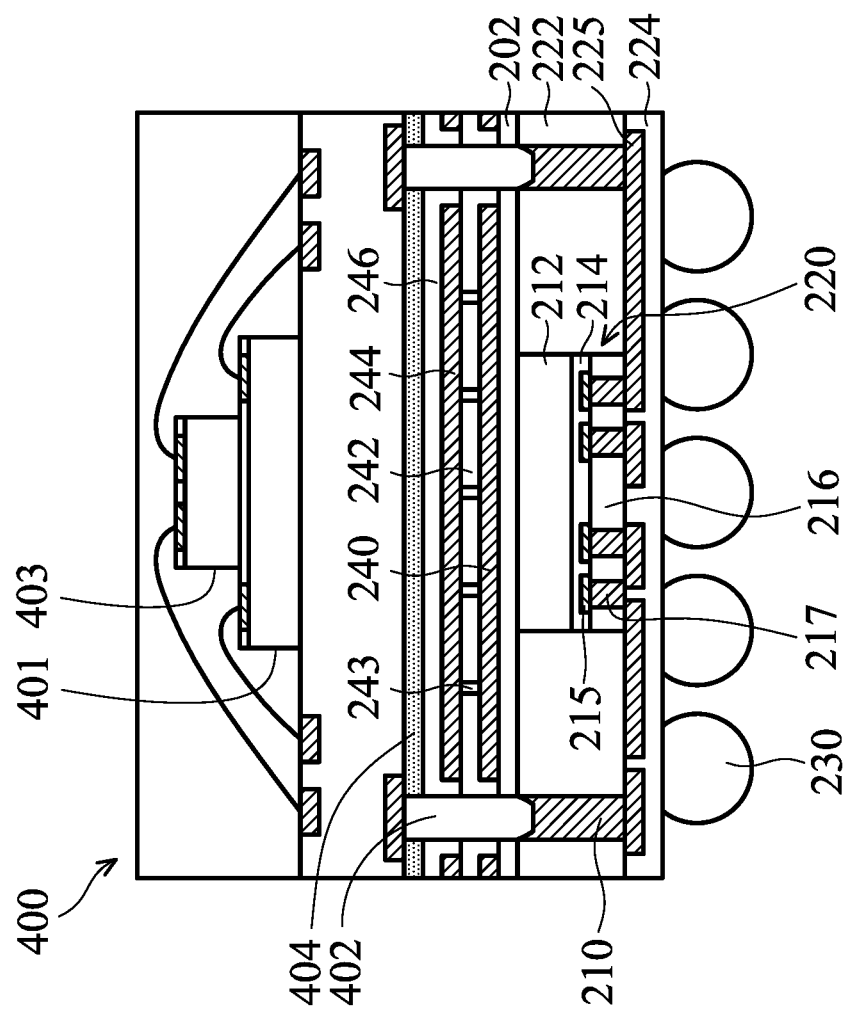

As shown in FIG. 1M, one or more elements 400 are stacked over the structure shown in FIG. 1L, in accordance with some embodiments. In some embodiments, each of the elements 400 includes another package structure that contains one or more semiconductor dies (e.g., memory dies). For example, each of the elements 400 includes a second semiconductor die 401 over the first cap layer 242. In some other embodiments, each of the elements 400 further includes a third semiconductor die 403 that is stacked on the second semiconductor die 401, as shown in FIG. 1M.

In some embodiments, the elements 400 are mounted or bonded onto the conductive features 210 through one or more connectors 402, as shown in FIG. 1M. In these cases, each of the connectors 402 is between the first semiconductor die 220 and the second semiconductor die 401, and successively passes through the second cap layer 246 in the opening 245, the first cap layer 242 in the opening 241 (indicated in FIG. 1L) and the opening 232 of the base layer 202 (indicated in FIG. 1K), such that the connectors 402 are electrically connected to the top surfaces of the conductive features 210. In some embodiments, the connectors 402 may include a pre-solder, a solder bump, a metal pillar, another suitable connector, or a combination thereof. In some embodiments, each of the connectors 402 is in direct contact with a corresponding one of the conductive features 210 for electrical connection. In some embodiments, an underfill material layer 404 is formed between the elements 400 and the thermal dissipation structure over the first semiconductor dies 220.

As shown in FIG. 1N, the structure shown in FIG. 1M is separated into a number of individual chip packages by performing a dicing process and the carrier 300 is removed, in accordance with some embodiments. As shown in FIG. 1N, one of the chip packages is depicted for simplify the diagram. The chip package includes the element 400 including a second package structure that is stacked on a first package structure including the thermal dissipation structure over the first semiconductor dies 220.

Many variations and/or modifications can be made to embodiments of the disclosure. For example, although the embodiments shown in FIGS. 1A-1N provide a chip package having a "fan-out" feature, embodiments of the disclosure are not limited thereto. Some other embodiments of the disclosure include chip packages having a "fan-in" feature.

Figure 2A:
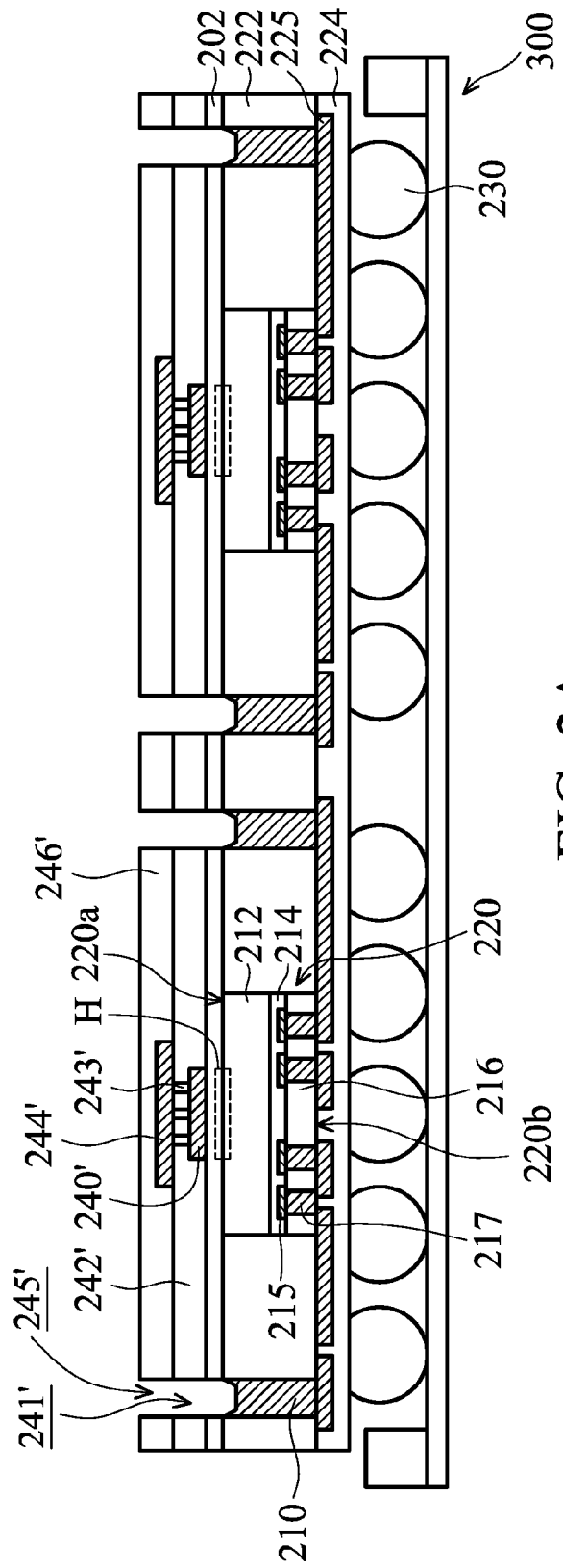
FIGS. 2A-2C are cross-sectional views of various stages of a process for forming a chip package, in accordance with some embodiments.
Figure 2B:
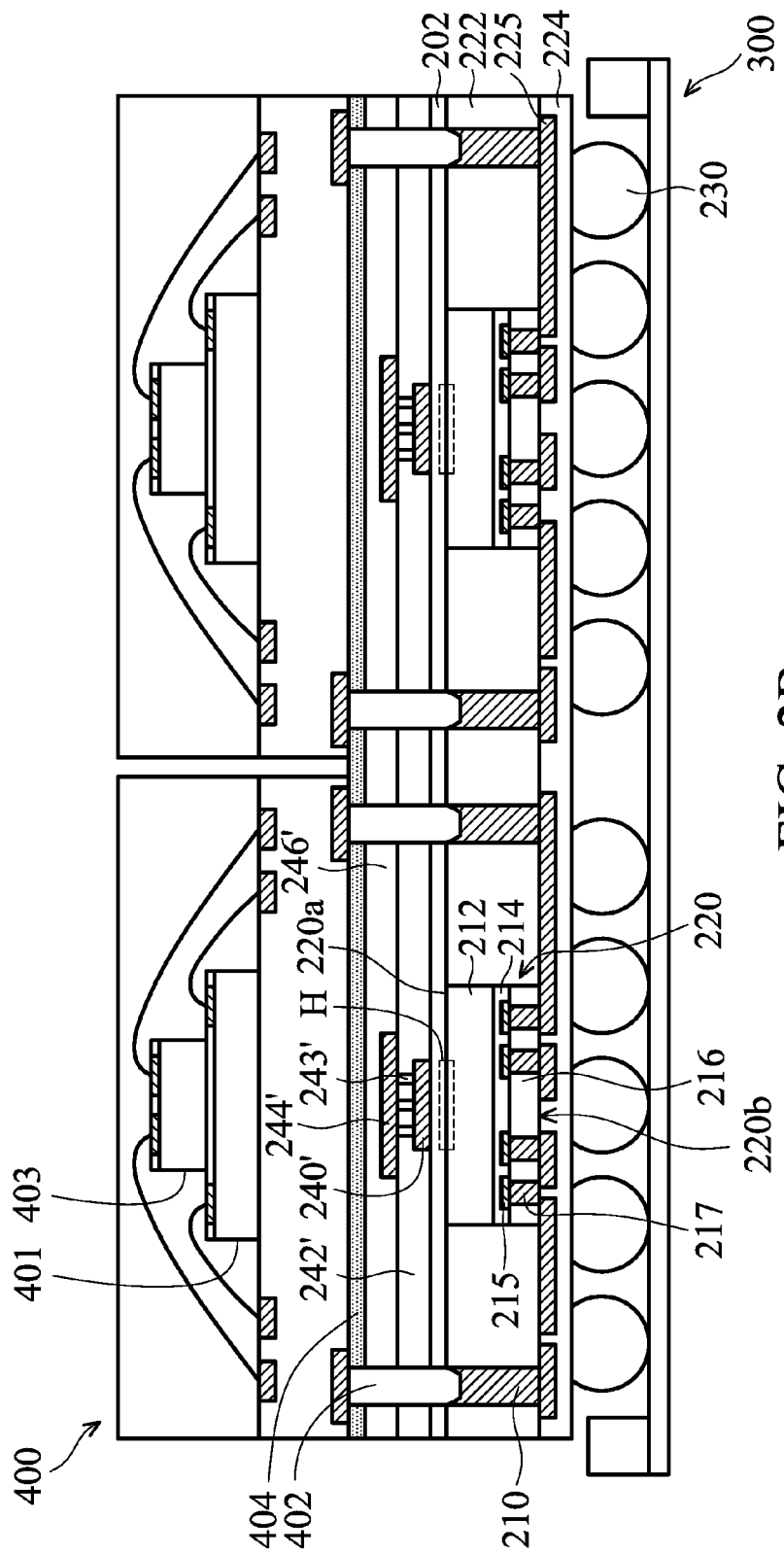
Figure 2C:
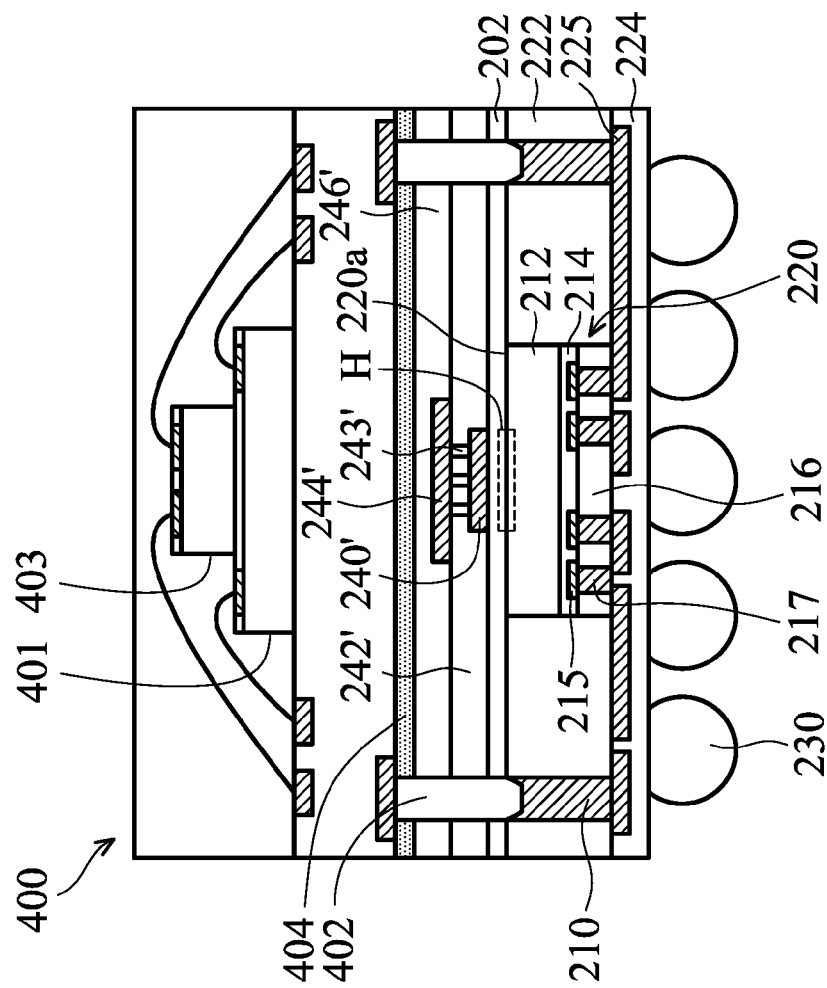

FIGS. 2A-2C are cross-sectional views of various stages of a process for forming a chip package, in accordance with some embodiments. As shown in FIG. 2A, a structure similar to that shown in FIG. 1K is provided. The heat generated from the semiconductor die 220 may be trapped therein and cause a sharp local temperature (sometimes referred to as a hot spot). For example, each of the first semiconductor dies 220 has at least a hot spot region H (as indicated by a dash-line region). Afterwards, a thermal dissipation structure is formed over the base layer 202, in accordance with some embodiments. In some embodiments, the thermal dissipation structure includes one or more heat-spreading layers and one or more cap layers that are in an alternate arrangement. For example, the thermal dissipation structure includes first heat-spreading layers 240' over a first side 220a of the semiconductor dies 220 and a first cap layer 242' on the first heat-spreading layer 240'. In some embodiments, the first cap layer 242' covers the top surface and sidewalls of each of the first heat-spreading layers 240 and surrounds the top surfaces of the conductive features 210. The first heat-spreading layer 240' may be in direct contact with the base layer 202 and the first cap layer 242' may be in direct contact with the first heat-spreading layer 240'. In some embodiments, each of the first heat-spreading layers 240' is formed directly above the corresponding hot spot region H and has an area that is substantially the same as or greater than that of the hot spot region H. As a result, the first heat-spreading layer 240' does not extend above the package layer 222. In these cases, the first cap layer 242' has openings 241' to correspondingly expose the conductive features 210, such that the top surfaces of the conductive features 210 are surrounded by the first cap layer 242'. In some embodiments, the first heat-spreading layer 240' is made of a material that is the same or similar to that of the first heat-spreading layer 240 shown in FIG. 1L. Similarly, the first cap layer 242' is made of a material that is the same as or similar to that of the first cap layer 242 shown in FIG. 1L.

In some embodiments, as shown in FIG. 2A, the thermal dissipation structure further includes a second heat-spreading layer 244' and an overlying second cap layer 246' stacked on the first cap layer 242'. The second heat-spreading layer 244' may be in direct contact with the first cap layer 242' and the second cap layer 246' may be in direct contact with the second heat-spreading layer 244'. Similarly, the second cap layer 246' covers the top surface and sidewalls of each of the second heat-spreading layers 244' and surrounds the top surfaces of the conductive features 210. The second heat-spreading layer 244' may be in direct contact with the first cap layer 242' and the second cap layer 246' may be in direct contact with the second heat-spreading layer 244'. In some embodiments, each of the second heat-spreading layers 244' is formed directly above the corresponding hot spot region H and has an area that is greater than that of the first heat-spreading layer 240'. As a result, the first heat-spreading layer 240' and the second heat-spreading layers 244' form a reverse trapezoid shape and do not extend above the package layer 222. In these cases, the second cap layer 246' has openings 245' that are respectively aligned with the openings 241' of the first cap layer 242' to expose the conductive features 210, such that the top surfaces of the conductive features 210 are also surrounded by the second cap layer 245'. In some embodiments, each of the second heat-spreading layers 244' formed directly above the corresponding hot spot region H has an area that is the same as that of the first heat-spreading layer 240'. In some embodiments, the first and second heat-spreading layers 240' are made of a material that is the same or similar to that of the first heat-spreading layers heat-spreading layer 240 shown in FIG. 1L. Similarly, the first and cap layer 242' is made of a material that is the same as or similar to that of the first cap layer 242 shown in FIG. 1L.

The materials and formation of the second heat-spreading layer 244' and the second cap layer 246' may be the same as or similar to these of the first heat-spreading layer 240' and the first cap layer 242'.

In some embodiments, thermal conductive plugs 243' are formed in the first cap layer 242' to connect the first heat-spreading layers 240' and second heat-spreading layers 244'. The thermal conductive plugs 243' may be made of a material that is the same as or similar to that of the thermal conductive plugs 243 shown in FIG. 1L.

Note that embodiments of the disclosure are not limited to FIG. 2A. Based on the requirements of thermal dissipation, one or more alternate arrangement including the heat-spreading layer and the cap layer may be stacked on the second cap layer 246'. For example, one or more stacks of a third heat-spreading layer (not shown) and a third cap layer (not shown) may be disposed on the second cap layer 246'. Moreover, thermal conductive plugs may be formed between the adjacent third heat-spreading layers. In some embodiments, the areas of the third heat-spreading layers are not the same and different from that of the first and second heat-spreading layers 240' and 244'.

In some embodiments, a dicing process is performed to separate the structure shown in FIG. 2A into multiple chip packages. In some other embodiments, more elements may be stacked on or bonded onto the structure as shown in FIG. 2A before the dicing process.

According to some embodiments of the disclosure, since the heat-spreading layer, such as copper, has better thermal conductivity and larger heat capacity, the thermal transfer rate can be effectively improved. Moreover, the heat-spreading layer can be formed on the underlying base layer without using an additional TIM layer. As a result, the thermal transfer rate can be improved further. Furthermore, since the one or more heat-spreading layers are merely formed above the hot spot region of the corresponding semiconductor die, the manufacturing cost of the thermal dissipation structure can be reduced. Additionally, since the thermal dissipation structure including one or more heat-spreading layers and one or more cap layers can improve the thermal transfer rate, there is no need to increase the thickness of the semiconductor dies for heat dissipation. As a result, compared to the case of increasing the thickness of the semiconductor dies for heat dissipation, the increase of the size (e.g., the height) of the package can be minimized.

As shown in FIG. 2B, one or more elements 400 are stacked over the structure shown in FIG. 2A, in accordance with some embodiments. In some embodiments, each of the elements 400 are mounted or bonded onto the conductive features 210 through one or more connectors 402, as shown in FIG. 1M. In these cases, each of the connectors 402 successively passes through the openings 245' and 241' (indicated in FIG. 2A) and the opening thereunder (as the opening 232 indicated in FIG. 1K), such that the connectors 402 are electrically connected to the top surfaces of the conductive features 210. In some embodiments, an underfill material layer 404 is formed between the elements 400 and the thermal dissipation structure over the first semiconductor dies 220.

As shown in FIG. 2C, the structure shown in FIG. 2B is separated into a number of individual chip packages by performing a dicing process and the carrier 300 is removed, in accordance with some embodiments. As shown in FIG. 2C, one of the chip packages is depicted for simplify the diagram. The chip package includes the element 400 including a second package structure that is stacked on a first package structure including the thermal dissipation structure over the first semiconductor dies 220.

Embodiments of the disclosure provide structures and formation methods of chip packages. The chip package includes a PoP structure having a thermal dissipation structure integrated into the bottom package and disposed between the top and bottom packages. Therefore, the thermal transfer rate for the chip package including a PoP structure can be effectively improved without increasing the thickness of the semiconductor die in the bottom package. Moreover, the hot spot issue in the bottom package can be effectively eliminated or mitigated by the thermal dissipation structure that is integrated into the bottom package. As a result, the reliability and performance of the chip package are improved significantly.

In accordance with some embodiments, a chip package is provided. The chip package includes a first package structure including a first semiconductor die that has a first side and a second side opposite thereto. The chip package also includes a package layer at least partially encapsulating the first semiconductor die, and a conductive feature in the package layer. The chip package further includes a first heat-spreading layer over the first side of the first semiconductor die and a first cap layer on the first heat-spreading layer.

In accordance with some embodiments, a chip package is provided. The chip package includes a first package structure including a first semiconductor die that has a first side and a second side opposite thereto. The chip package also includes a package layer at least partially encapsulating the first semiconductor die, and a conductive feature in the package layer. The chip package further includes a first heat-spreading layer over the first side of the first semiconductor die, a first cap layer on the first heat-spreading layer, a second heat-spreading layer on the first cap layer, and a second cap layer on the second heat-spreading layer.

In accordance with some embodiments, a method for forming a chip package is provided. The method includes forming a conductive feature and attaching a first semiconductor die over the carrier substrate. The method also includes forming a package layer over the carrier substrate to at least partially encapsulate the first semiconductor die and the conductive feature, and removing the carrier substrate. The method further includes forming a first heat-spreading layer over the package layer and the first semiconductor die and forming a first cap layer on the first heat-spreading layer, and stacking a second semiconductor die over the first cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
  a first package structure, comprising:
    a first semiconductor die having a first side and a second side opposite thereto;
    a package layer at least partially encapsulating the first semiconductor die;
    a conductive feature in the package layer;
    a first heat-spreading layer over the first side of the first semiconductor die; and
    a first cap layer on the first heat-spreading layer,
    wherein the first heat-spreading layer is disposed above a hot spot region of the first semiconductor die and has an area that is substantially the same as or larger than that of the hot spot region.

2. The chip package as claimed in claim 1, wherein the first heat-spreading layer extends over the package layer.

3. The chip package as claimed in claim 2, wherein the first heat-spreading layer is disposed over the conductive feature, and a portion of the first cap layer passes through the first heat-spreading layer and surrounds a top surface of the conductive feature.

4. The chip package as claimed in claim 3, further comprising:
  a second package structure, comprising:
    a second semiconductor die over the first cap layer; and
    a connector between the first semiconductor die and the second semiconductor die, wherein the connector passes through the first heat-spreading layer and the portion of the first cap layer, such that the connector is electrically connected to the top surface of the conductive feature.

5. The chip package as claimed in claim 1, wherein the first cap layer covers a sidewall of the first heat-spreading layer and surrounds a top surface of the conductive feature.

6. The chip package as claimed in claim 5, further comprising:
a second package structure, comprising:
a second semiconductor die over the first cap layer; and
a connector between the first semiconductor die and the second semiconductor die, wherein the connector passes through the first cap layer, such that the connector is electrically connected to the top surface of the conductive feature.

7. The chip package as claimed in claim 1, wherein the first package structure further comprises a redistribution layer over the package layer and the second side of the first semiconductor die, and wherein the conductive feature is electrically connected to the first semiconductor die through the redistribution layer.

8. The chip package as claimed in claim 1, wherein the first heat-spreading layer comprises copper.

9. A chip package, comprising:
a first package structure, comprising:
a first semiconductor die having a first side and a second side opposite thereto;
a package layer at least partially encapsulating the first semiconductor die;
a conductive feature in the package layer;
a base layer over the first side of the first semiconductor die;
a first heat-spreading layer electrically insulating from first semiconductor die by the base layer;
a first cap layer on the first heat-spreading layer;
a second heat-spreading layer on the first cap layer; and
a second cap layer on the second heat-spreading layer.

10. The chip package as claimed in claim 9, wherein the first package structure further comprises a plurality of thermal conductive plugs in the first cap layer to connect the first and second heat-spreading layers.

11. The chip package as claimed in claim 9, wherein the first and second heat-spreading layers extend over the package layer and are disposed over the conductive feature, and wherein portions of the first and second cap layers pass through the first and second heat-spreading layers, respectively, and surround a top surface of the conductive feature.

12. The chip package as claimed in claim 11, further comprising:
a second package structure, comprising:
a second semiconductor die over the second cap layer; and
a connector between the first semiconductor die and the second semiconductor die, wherein the connector passes through the of the first and second heat-spreading layers and the portions of the first and second cap layers, such that the connector is electrically connected to the top surface of the conductive feature.

13. The chip package as claimed in claim 9, wherein the first cap layer covers a sidewall of the first heat-spreading layer, the second cap layer covers a sidewall of the second heat-spreading layer, and the first and second cap layers surround a top surface of the conductive feature, and wherein the chip package further comprises:
a second package structure, comprising:
a second semiconductor die over the second cap layer; and
a connector between the first semiconductor die and the second semiconductor die, wherein the connector passes through the first and second cap layers, such that the connector is electrically connected to the top surface of the conductive feature.

14. The chip package as claimed in claim 9, wherein the first and second heat-spreading layers comprise copper and are disposed above a hot spot region of the first semiconductor die, and wherein the first heat-spreading layer has an area that is substantially the same as or larger than that of the hot spot region and the second heat-spreading layer has an area that is the same as or larger than that of the hot spot region.

15. The chip package as claimed in claim 9, further comprising:
a plurality of stacks of a third heat-spreading layer and a third cap layer on the second cap layer, wherein the area of each third heat-spreading layer is not the same and is different from that of the first and second heat-spreading layers.

16. The chip package as claimed in claim 9, wherein the first and second heat-spreading layers comprise copper and are disposed above a hot spot region of the first semiconductor die.

17. A chip package, comprising:
a first package structure, comprising:
a first semiconductor die having a first side and a second side opposite thereto;
a package layer at least partially encapsulating the first semiconductor die;
a conductive feature in the package layer;
a first heat-spreading layer disposed above a hot spot region over the first side of the first semiconductor die, wherein the first heat-spreading layer has a first area;
a first cap layer on the first heat-spreading layer;
a second heat-spreading layer on the first cap layer, wherein the second heat-spreading layer has a second area greater than the first area; and
a second cap layer on the second heat-spreading layer.

18. The chip package as claimed in claim 17, further comprising:
a second package structure, comprising:
a second semiconductor die over the second cap layer; and
a connector between the first semiconductor die and the second semiconductor die, wherein the connector passes through the first and second cap layers, such that the connector is electrically connected to the top surface of the conductive feature.

19. The chip package as claimed in claim 17, wherein the first heat-spreading layer and the second heat-spreading layer do not extend above the package layer.

20. The chip package as claimed in claim 17, wherein the first area is substantially the same as or larger than that of the hot spot region.

* * * * *